US008288082B2

(12) United States Patent
Baik et al.

(10) Patent No.: US 8,288,082 B2
(45) Date of Patent: Oct. 16, 2012

(54) METHOD OF FABRICATING TRIODE-STRUCTURE FIELD-EMISSION DEVICE

(75) Inventors: Chan Wook Baik, Seongnam-si (KR); Junhee Choi, Seongnam-si (KR); Seog Woo Hong, Yongin-si (KR); Joo Ho Lee, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 829 days.

(21) Appl. No.: 12/292,027

(22) Filed: Nov. 10, 2008

(65) Prior Publication Data

US 2009/0233240 A1 Sep. 17, 2009

(30) Foreign Application Priority Data

Mar. 17, 2008 (KR) ........................ 10-2008-0024501

(51) Int. Cl.
*G03F 7/11* (2006.01)

(52) U.S. Cl. ........ 430/319; 430/312; 430/313; 430/314; 430/317; 430/318

(58) Field of Classification Search ........................ None
See application file for complete search history.

(56) References Cited

U.S. PATENT DOCUMENTS

| | | | | |
|---|---|---|---|---|
| 4,767,721 | A | 8/1988 | Liao et al. | |
| 7,411,341 | B2 * | 8/2008 | Hudspeth et al. | 313/309 |
| 2007/0248905 | A1 | 10/2007 | Ohta et al. | |

FOREIGN PATENT DOCUMENTS

| | | |
|---|---|---|
| JP | 08-148083 | 6/1996 |
| KR | 100590579 | 6/2006 |
| KR | 1020060119150 | 11/2006 |
| KR | 1020070090524 | 9/2007 |

* cited by examiner

*Primary Examiner* — Daborah Chacko Davis
(74) *Attorney, Agent, or Firm* — Harness, Dickey & Pierce, P.L.C.

(57) ABSTRACT

Example embodiments provide a method of fabricating a triode-structure field-emission device. A cathode, an insulating layer, and a gate metal layer may be sequentially formed on a substrate. A first resist pattern having a first opening and a second resist pattern having a second opening smaller than the first opening may be formed to be sequentially laminated on the gate metal layer. Then, the gate metal layer and the insulating layer may be etched using the first resist pattern to form a gate electrode and an insulating layer having a first hole and a second hole corresponding to the first opening. A catalyst layer may be formed on the cathode exposed through the first and second holes using the second resist pattern. After the first resist pattern, second resist pattern, and the catalyst layer on the second resist pattern are removed, an emitter may be formed on the catalyst layer in the second hole.

15 Claims, 8 Drawing Sheets

METHOD OF FABRICATING TRIODE-STRUCTURE FIELD-EMISSION DEVICE

CROSS-REFERENCE TO RELATED APPLICATION

This application claims priority under 35 U.S.C. §119 to Korean Patent Application No. 10-2008-0024501, filed on Mar. 17, 2008, in the Korean Intellectual Property Office, the entire contents of which are incorporated herein by reference.

BACKGROUND

1. Field

Example embodiments provide a method of fabricating a triode-structure field-emission device, and more particularly, a method of fabricating a triode-structure field-emission device capable of controlling the size of a gate hole using a two layer structure resist pattern.

2. Description of the Related Art

A diode field-emission device may include an upper substrate and a lower substrate which face each other at a given interval, an anode and a cathode formed on the facing surfaces of the upper and lower substrates, a phosphor with which the anode is coated, and an emitter formed on the cathode. However, it may be difficult to apply the diode field-emission device to a display device, since the diode field-emission device may have difficulties controlling the electrons emitted from the emitter.

In order to improve control of the electrons emitted from the field-emission device, a triode-structure field-emission device was developed. The triode-structure field-emission device may include a triode which is a cathode, a gate electrode, and an anode. The gate electrode may face the cathode with the insulating layer of a lower substrate interposed. The gate electrode for controlling the emission of the electrons may have a gate hole structure and may apply an electric field to an emitter provided in the cathode of the lower substrate to emit the electrons using electron beam tunneling effect. The field-emission characteristics of the triode-structure field-emission device may vary with the distance between the gate hole and the emitter, the alignment state of the gate hole and the emitter, or the size of the gate hole, or any combination thereof.

SUMMARY

Example embodiments provide a method of fabricating a triode-structure field-emission device capable of controlling the size of a gate hole using one mask to improve the production efficiency of a field-emission device and to improve the field-emission characteristics of the field-emission device.

Example embodiments provide that a method of fabricating a triode-structure field-emission device may include sequentially forming a cathode, an insulating layer, and a gate metal layer on a substrate, forming a first resist pattern having a first opening on the gate metal layer, forming a second resist pattern having a second opening on the first resist pattern, wherein the second opening is smaller than the first opening, sequentially etching the gate metal layer and the insulating layer using the first resist pattern as a first mask pattern to form a gate electrode having a first hole and an insulating layer having a second hole, wherein the first hole and the second hole correspond to the first opening, forming a catalyst layer on the second resist pattern and on a portion of the cathode exposed through the first hole and the second hole using the second resist pattern as a second mask pattern, removing the first resist pattern, the second resist pattern, and the catalyst layer formed on the second resist pattern, and forming an emitter on the catalyst layer in the second hole.

In example embodiments, forming the first resist pattern having the first opening on the gate metal layer and the second resist pattern having a second opening on the first resist pattern, wherein the second opening is smaller than the first opening may include sequentially coating a first resist and a second resist on the gate metal layer, exposing the first resist and the second resist, and developing the first resist and second resist to form the first resist pattern and the second resist pattern.

In example embodiments, the developing speed of the first resist may be faster than the developing speed of the second resist.

In example embodiments, a size of the first opening may be controlled by a developing time of the first resist.

In example embodiments, the first resist may be a photosensitive resist or a non-photosensitive resist.

In example embodiments, the second resist may be a photosensitive resist.

In example embodiments, a size of the first hole of the gate electrode may be controlled by a size of the first opening of the first resist pattern.

In example embodiments, a size of catalyst layer formed on the cathode may be controlled by a size of the second opening of the second resist pattern.

In example embodiments, the emitter may be formed of a nano wire, a nano tube, or nano particles.

In example embodiments, the nano wire, the nano tube, or nano particles may be formed of carbon or a metal oxide.

BRIEF DESCRIPTION OF THE DRAWINGS

The above and other features and advantages of example embodiments will become more apparent by describing them in detail with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION

Figure 1A:
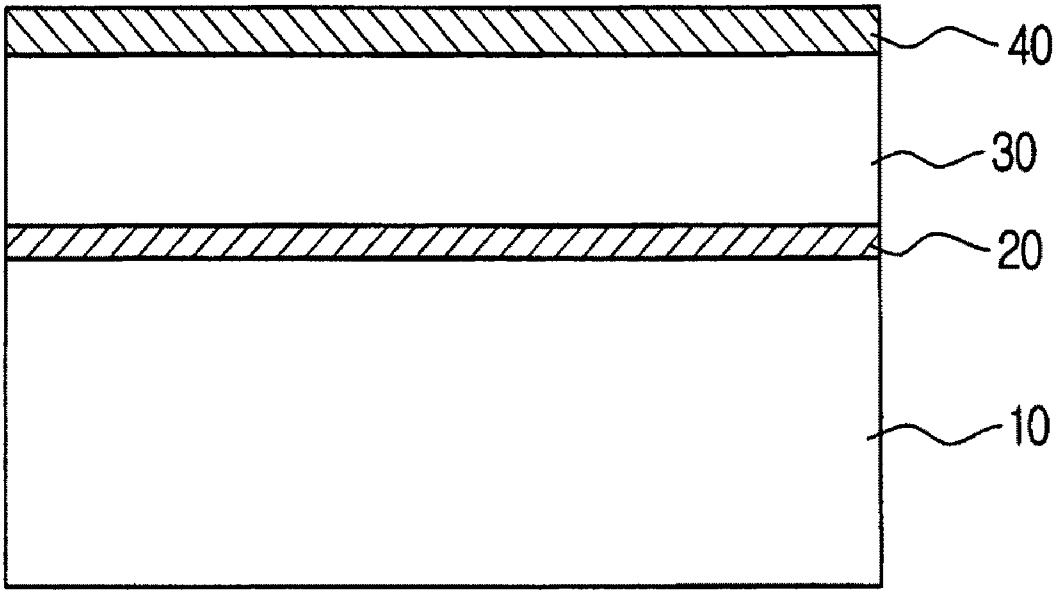
FIGS. 1A through 1H are sectional views illustrating processes of fabricating a triode-structure field-emission device according to example embodiments.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

FIGS. 1A through 1H are sectional views illustrating processes of fabricating a triode-structure field-emission device according to example embodiments First, as shown in FIG. 1A, a cathode 20, an insulating layer 30, and a gate metal layer 40 may be sequentially formed on a substrate 10. For example, a substrate made of Si, $Al_2O_3$, or ceramic that can withstand a higher temperature may be used as the substrate 10, and a glass substrate may be used when an emitter is formed at a lower temperature. The cathode 20 may be formed of metals such as Al, Cr, Ag, and Mo, alloys of the metals, or a transparent electrode material. The cathode 20 may be formed on the substrate 10 by a deposition method such as an electron beam evaporation method or a sputtering method.

The insulating layer 30 may be formed by depositing an insulating material such as $SiO_2$, $Si_3N_4$, and $Al_2O_3$ on the cathode 20. For example, the insulating layer 30 may be deposited on the cathode 20 using a chemical vapor deposition (CVD) method.

The gate metal layer 40 may be formed of a conductive material such as Cr and Nb and may be deposited on the insulating layer 30 by an electron beam deposition method or a sputtering method. The gate metal layer may be formed using the same method as the cathode 20 but is not limited thereto.

Figure 1B:
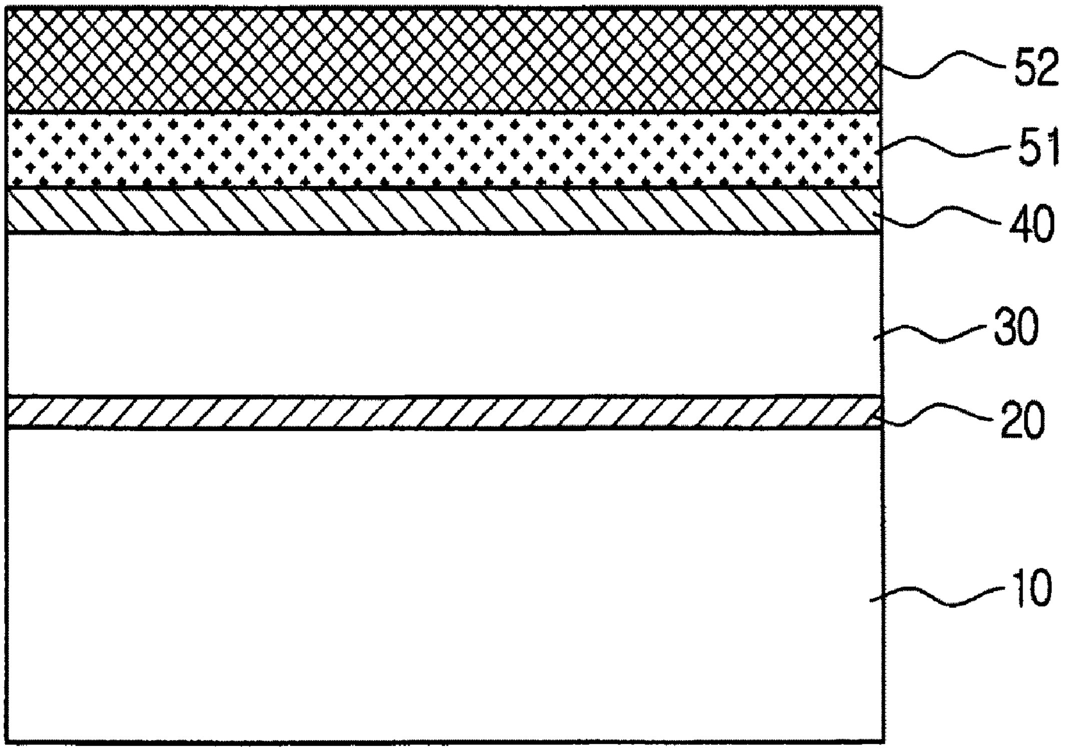
Figure 1C:
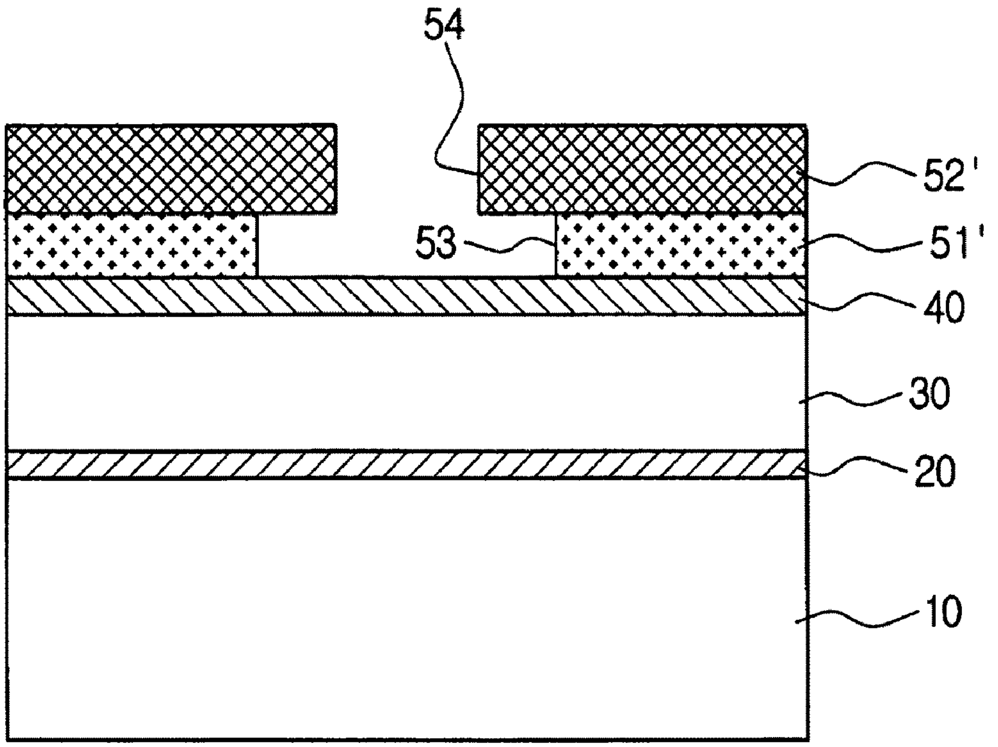

Next, as shown in FIG. 1C, a first resist pattern 51' may be formed on the gate metal layer 40 and may have a first opening 53 and a second resist pattern 52' may be formed on the first resist pattern 51' and may have a second opening 54 smaller than the first opening 53.

As shown in FIG. 1B, a first resist 51 and a second resist 52 may be sequentially coated on the gate metal layer 40. The first and second resists 51 and 52 may be coated on the gate metal layer 40 by a spin coating method, for example.

Next, a mask (not shown) having a window pattern may be provided on the first and second resists 51 and 52 to expose portions of the first and second resists 51 and 52 to ultraviolet (UV) rays or an electron beam, for example. The window pattern of the mask may correspond to the second opening 54.

After exposing the first and second resists 51 and 52, the first and second resists 51 and 52 may be developed to form the first and second resist patterns 51' and 52'. A dipping method, a paddle method, or a shower method may be used as a developing method. Example embodiments of the developing processes provide that the exposed part of the second resist 52 may be developed to form the second resist pattern 52' having the second opening 54. Then, a developing solution may permeate the first resist 51 through the second opening 54 to etch the first resist 51 and form the first resist pattern 51' having the first opening 53. The size of the first opening 53 may be controlled by the developing time of the first resist 51, and the size of the first opening 53 may be varied by varying the developing time of the first resist 51. For example, the first opening 53 may be formed to be larger than the second opening 54 by increasing the developing time, and a first resist pattern 51' having an undercut shape may be formed.

Example embodiments provide that the same or different developing solutions may be used to develop the first and second resists. A positive photosensitive resist may be used as the second resist 52 and a photosensitive or non-photosensitive resist may be used as the first resist 51.

In alternative example embodiments, the first resist 51 may be a non-photosensitive resist and the second resist 52 may be a photosensitive resist, and after a developing process is performed, the second resist pattern 52 may have a second opening 54 of the same size as the window pattern of the mask, and the first resist pattern 51 may have a first opening 53 whose size is controlled by the developing time and is unaffected by the amount of exposure.

If both the first resist and the second resist are photosensitive resists, the developing characteristics of the first and second resists 51 and 52 based on the developing solution may be different from each other. For example, the developing speed of the first resist 51 may be different from the developing speed of the second resist 52. The developing speed of the first resist 51 may be faster than the developing speed of the second resist 52 when the same developing solution is used.

Figure 1D:
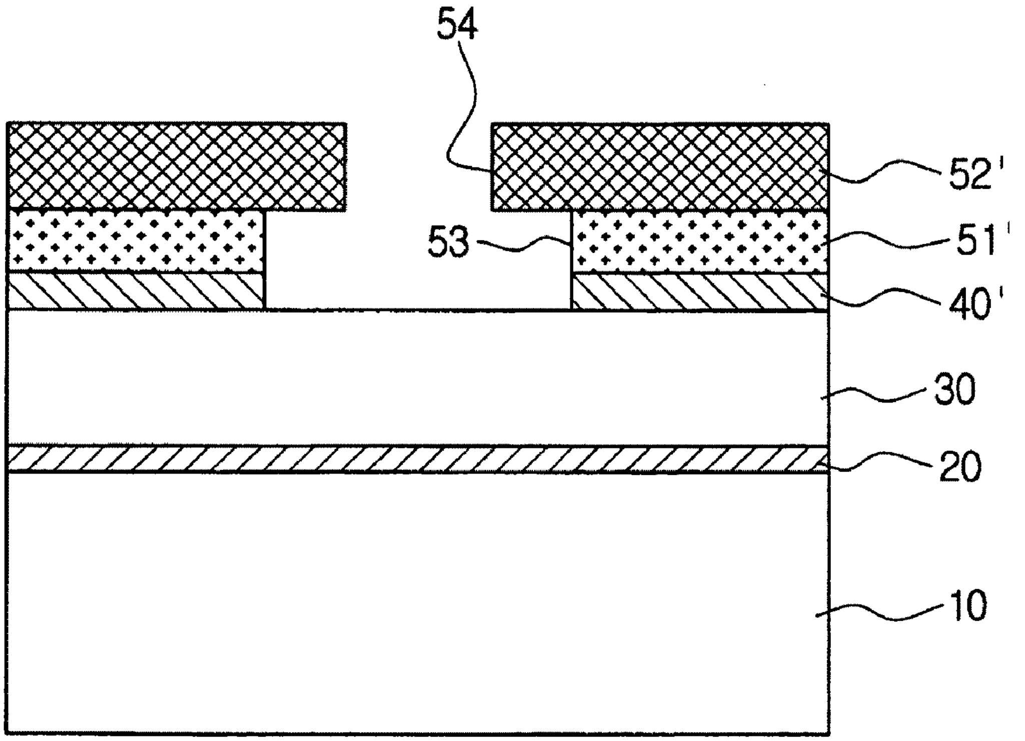
Figure 1E:
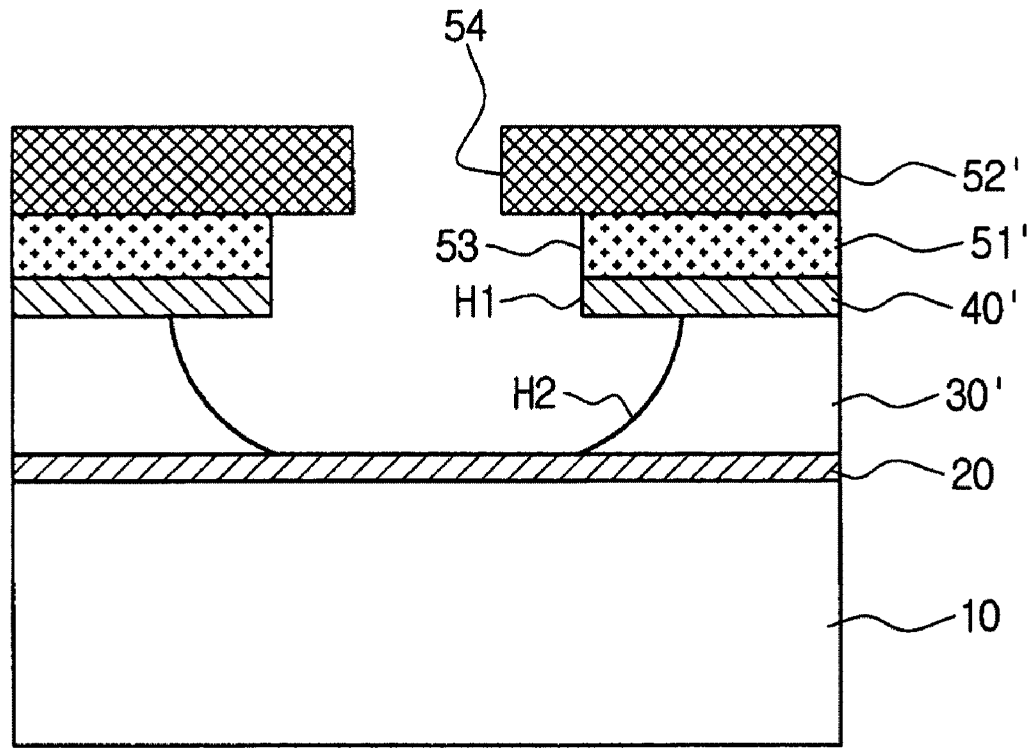

Next, as shown in FIGS. 1D and 1E, the gate metal layer 40 and the insulating layer 30 may be sequentially etched using the first resist pattern 51' as a first mask pattern.

A portion of the gate metal layer 40 may be exposed by the first opening 53 of the first resist pattern 51' and the exposed portion may be etched so that a gate electrode 40' having a first hole H1 corresponding to the first opening 53 is formed. The size of the first hole H1 of the gate electrode 40' may be controlled in accordance with the size of the first opening 53 of the first resist pattern 51'. Accordingly, the gate electrode 40' having the first hole H1 of various sizes may be formed by controlling the developing speed of the first resist 51.

Figure 2A:
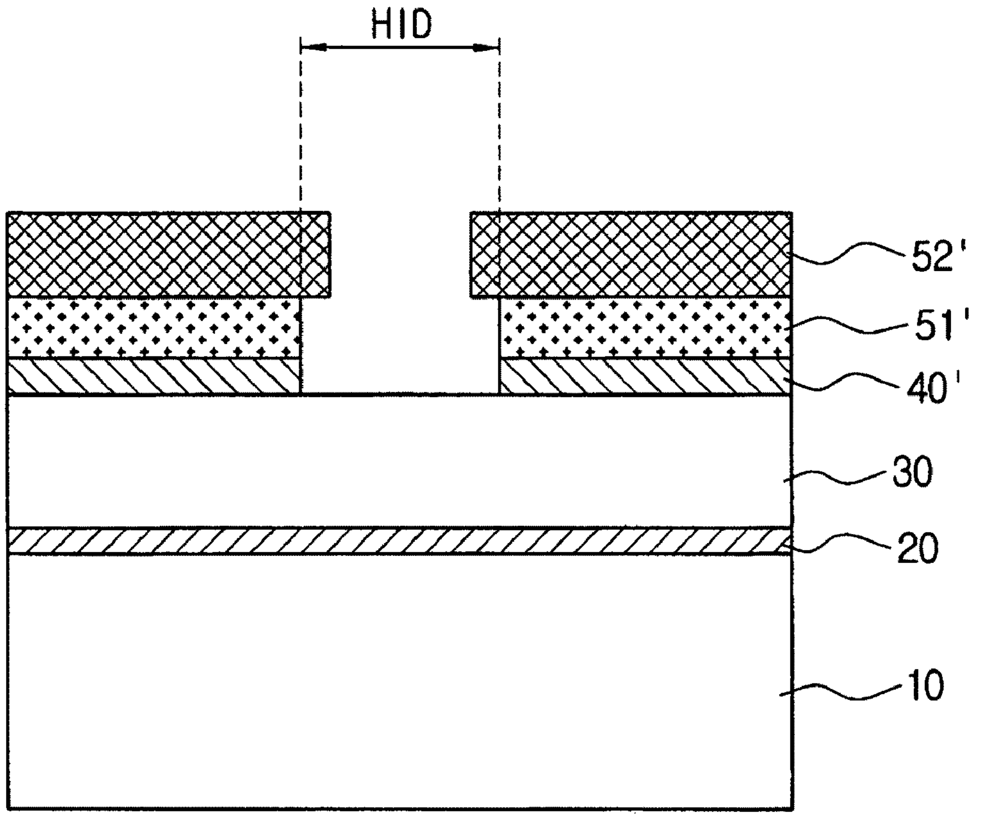
FIGS. 2A and 2B are sectional views illustrating example embodiments of a change in the diameter of the first hole of a gate electrode according to the size of the first opening of a first resist pattern.
Figure 2B:
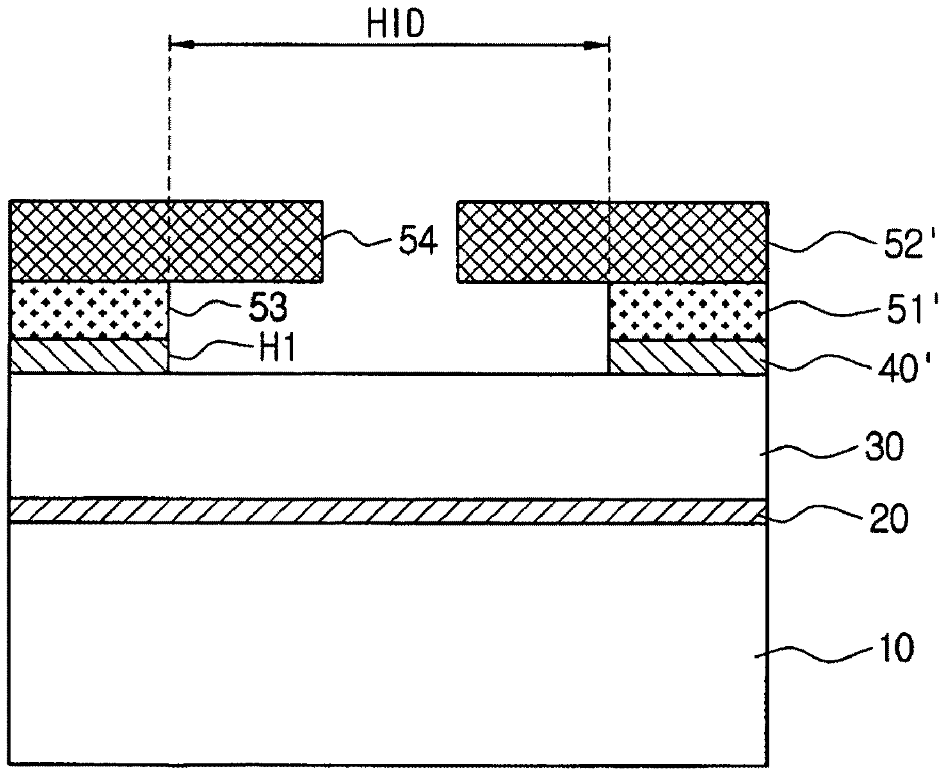

FIGS. 2A and 2B are sectional views illustrating example embodiments of a change in the diameter of the first hole of the gate electrode according to the size of the first opening of the first resist pattern.

As shown in FIGS. 2A and 2B, the first resist pattern 51' having the first opening 53 may be formed to a given size by controlling the developing time of the first resist 51. The diameter H1D of the first hole H1 of the gate may be controlled by the size of the first opening 53.

As described above, when the two-layered first and second resist patterns 51' and 52' according to example embodiments are used, the size of the first hole H1 of the gate electrode 40' may be changed using one mask by controlling only the developing time of the first resist 51.

Referring to FIG. 1E, after the gate metal layer 40 is etched, the insulating layer 30 may be etched to form an insulating layer 30' having a second hole H2 that corresponds to the first opening 53. The cathode 20 provided under the insulating layer 30' may be exposed by the first and second holes H1 and H2.

Figure 1F:
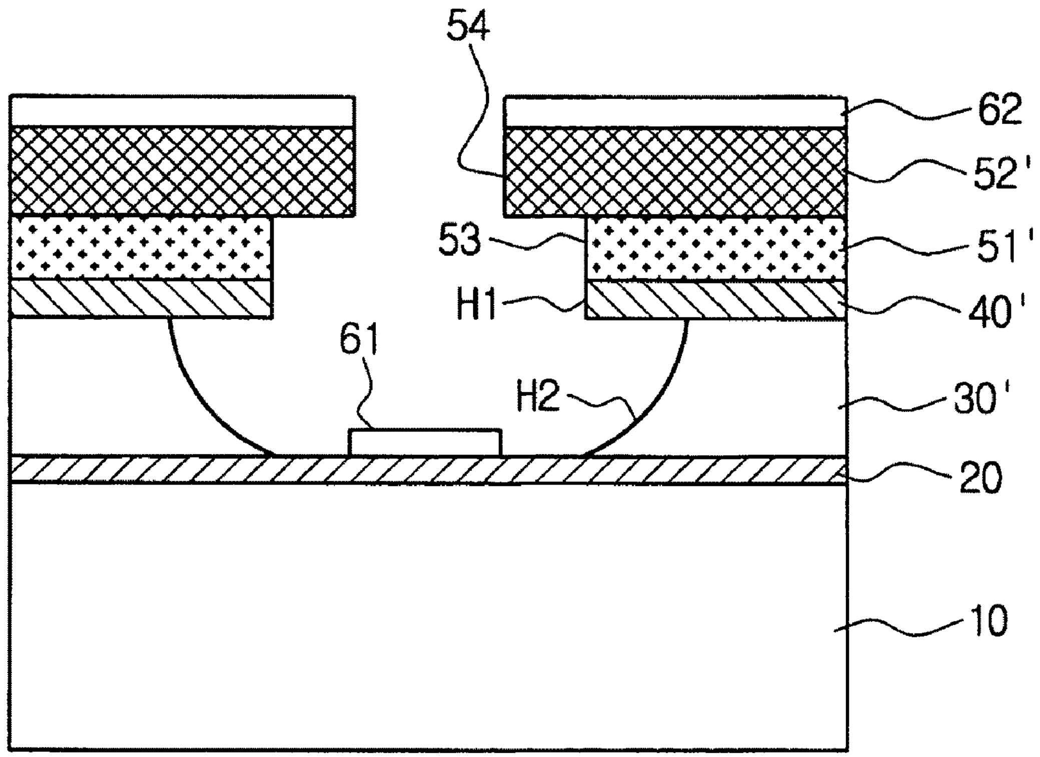

Then, as shown in FIG. 1F, a catalyst layer 61 may be formed on the cathode 20 exposed through the first and second holes H1 and H2 using the second resist pattern 52' as a second mask pattern.

The catalyst layer 61 may be required for growing the emitter (shown as reference numeral 70 in FIG. 1H) on the cathode 20. The material used to form the catalyst layer 61 may vary based on the material used to form the emitter. For example, when the emitter is formed of carbon nano tube (CNT), the catalyst layer 61 may be deposited on the exposed cathode 20 through an electron beam deposition method using a material such as Fe, Co, Ni, or INVAR® (an alloy corresponding to the registered trademark of STE. AME. DE COMMENTARY FOURCHAMBAULT ET DECAZEVILLE CORPORATION, which is an alloy of Ni and Fe). An adhesion layer and a buffer layer may be additionally formed between the catalyst layer 61 and the cathode 20. The adhesion layer and the buffer layer may include Ti and Al. If the emitter is formed of CNT, the catalyst layer 61 may be formed to a thickness of 1 to 100 nm.

The catalyst layer 61 deposited on the cathode 20 may correspond to the second opening 54 of the second resist pattern 52' in size and shape. Therefore, the pattern of the catalyst layer 61 deposited on the cathode 20 may be controlled by the size and the shape of the second opening 54. As described above, the pattern of the catalyst layer 61 may be determined by the second resist pattern 52' and may be unaffected by the first resist pattern 51'.

Therefore, when the first and second resists 51 and 52 are used, the pattern of the first hole H1 of the gate electrode and the pattern of the catalyst layer 61 may be independently controlled using only one mask. Accordingly, costs incurred by using additional masks may be saved and self-alignment may be performed.

Figure 1G:
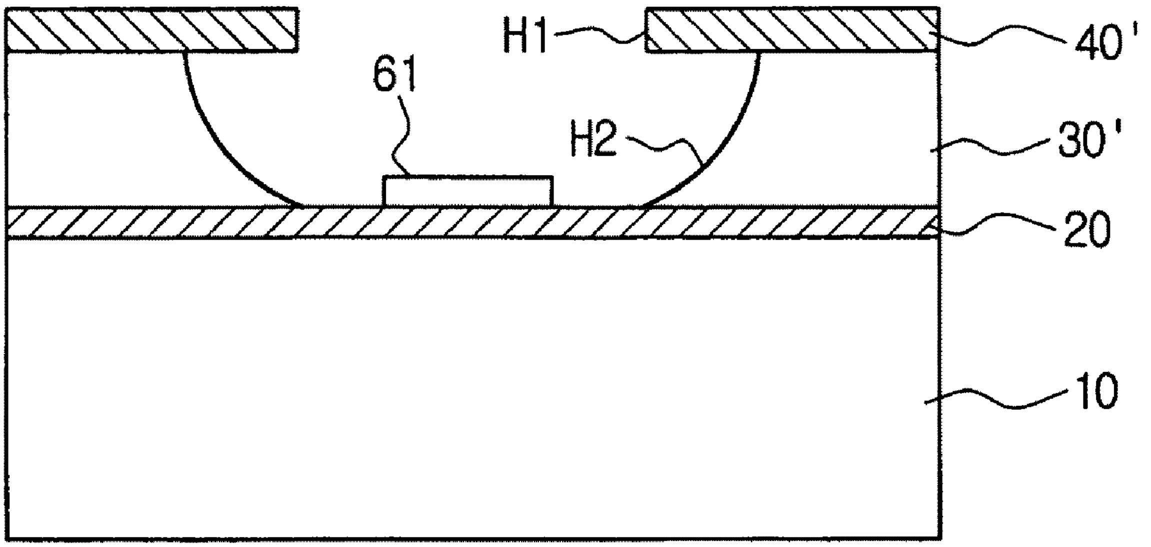

In additional example embodiments, as shown in FIG. 1F, a catalyst layer 62 may be formed on the second resist pattern 52'. Then, in order to form an emitter on the catalyst layer 61 as shown in FIG. 1G, a lift-off process where the first resist pattern 51', the second resist pattern 52', and the catalyst layer 62 are removed from the substrate 10 may be performed.

Figure 1H:
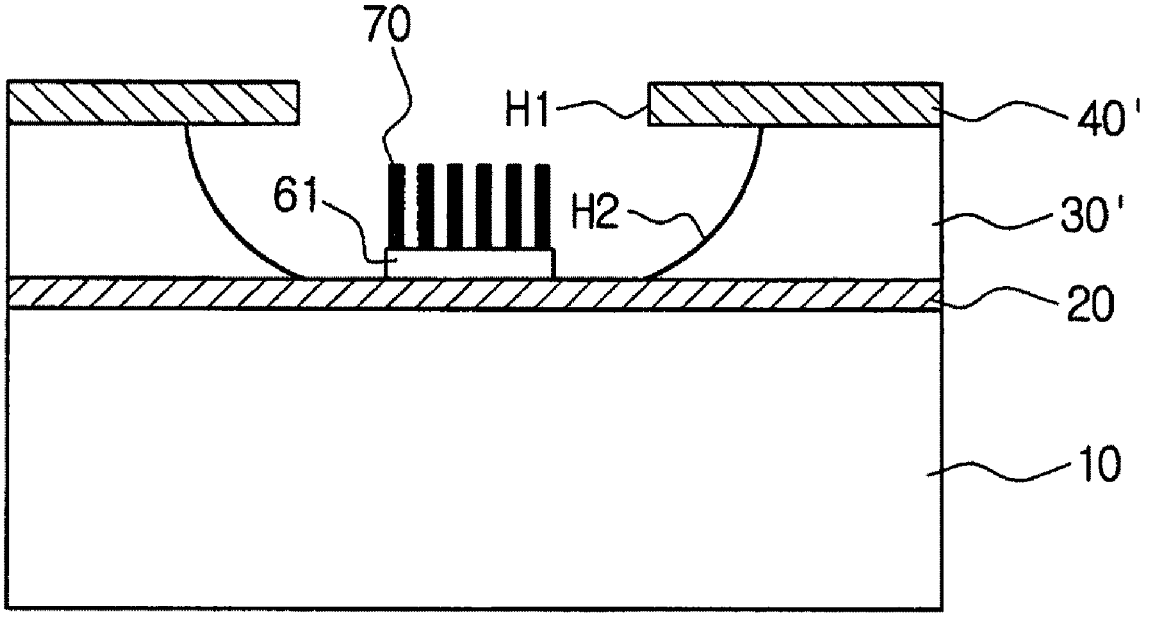

After performing the lift-off process, as shown in FIG. 1H, an emitter 70 may be formed on the catalyst layer 61 in the second hole H2. The emitter 70 may be formed of nano wire, a nano tube, or nano particles grown by a catalyst. For example, the nano wire, a nano tube, or nano particles may be formed of carbon, a metal oxide such as silicon oxide, tin oxide and zinc oxide, or gallium nitride.

Although the emitter 70 may be formed of CNT, example embodiments are not limited thereto.

The emitter 70 may be formed by growing the CNT on the catalyst layer 61 by the CVD method using a hydrocarbon gas such as $C_2H_2$, $C_2H_4$, and $CH_4$ or a $CO_x$ gas. A CNT growing area of the catalyst layer 61 may be determined by the size of the second opening 54 of the second resist pattern 52' and this determination may be unaffected by of the first resist pattern 51'.

As described above, the pattern of the first hole H1 of the gate electrode 40' may be controlled by the first resist pattern 51' and the CNT growing area, and accordingly the area of the catalyst layer 61 of the emitter 70 may be controlled independently by the second resist pattern 52'.

When the first resist pattern 51' and second resist pattern 52' are used, the size of the first hole H1 of the gate electrode 40' may be changed and the pattern of the catalyst layer 61 may be determined using one mask.

Therefore, in order to independently control the pattern of the first hole H1 of the gate electrode 40' and the pattern of the catalyst layer 61, it may not be necessary to use an additional mask. As a result, the fabricating time and cost of the field-emission device may be reduced. In addition, it is possible to avoid the misalignment of masks which may occur when more than one mask is used.

Figure 3:
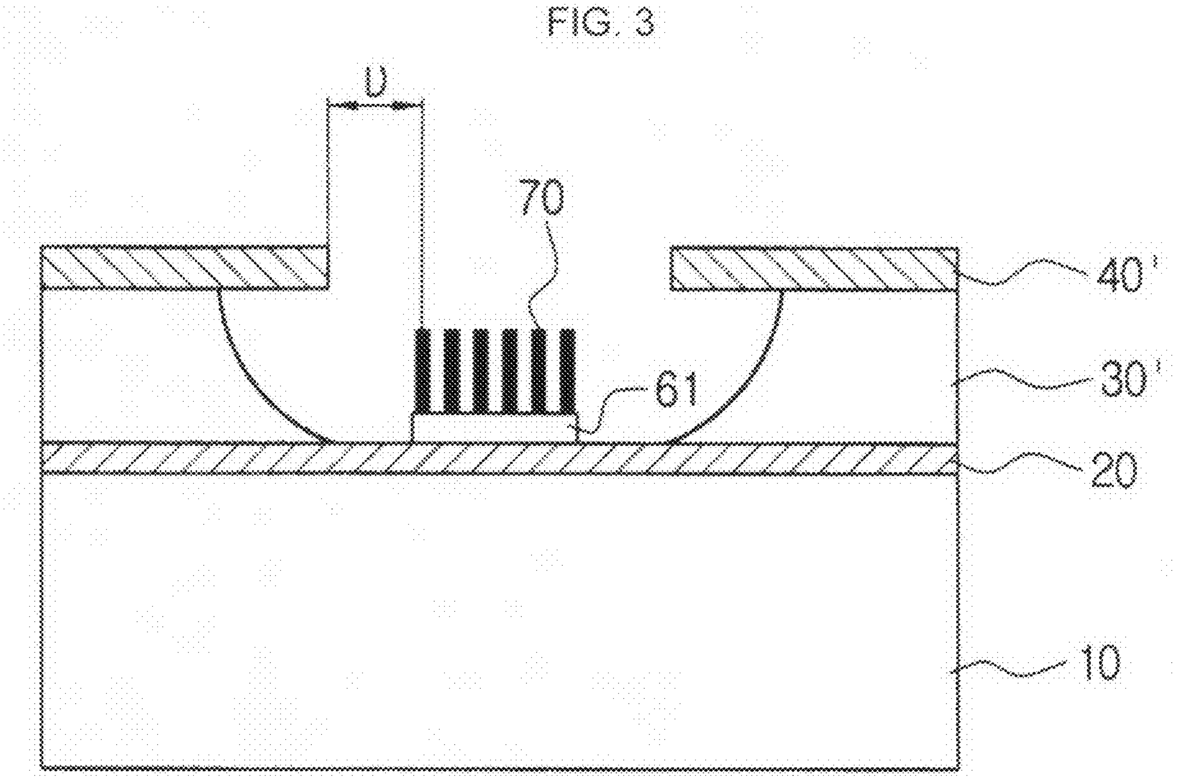
FIG. 3 is a sectional view illustrating the lower substrate of a triode-structure field-emission device formed by a method of fabricating the triode-structure field-emission device according to example embodiments.

FIG. 3 is a sectional view illustrating the lower substrate of a triode-structure field-emission device formed by a method of fabricating the triode-structure field-emission device according to example embodiments.

As described above, the size of the first hole H1 of the gate electrode 40' may be controlled only by the developing time of the first resist 51. As a result, the trajectory of the electron beam emitted from the emitter 70 may be controlled by the first hole H1. The first hole H1 is illustrated by the distance D between the emitter 70 and the gate electrode 40' in FIG. 3. For example, when the distance D is smaller, the emitted electron beam may be more diffused. The emitted electron beam may be focused by increasing the distance D. Accordingly, the electron beam of an electron emission device may be controlled.

Additionally, it may be possible to reduce or prevent the flow of electrons emitted from the emitter 70 toward the insulating layer 30' due to a contact with the emitter 70 and the gate electrode 40'.

FIGS. 4A through 4D are scanning electron microscopy (SEM) photographs illustrating the field-emission device formed according to example embodiments.

Figure 4A:
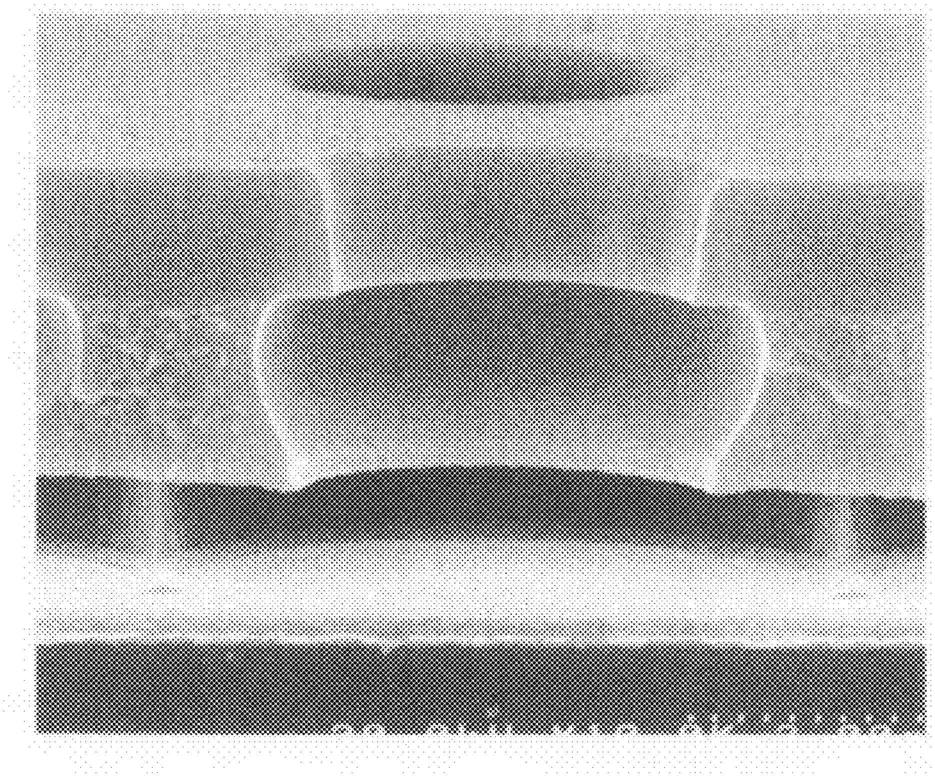
FIGS. 4A through 4D are scanning electron microscopy (SEM) photographs illustrating the field-emission device formed according to example embodiments.
Figure 4B:
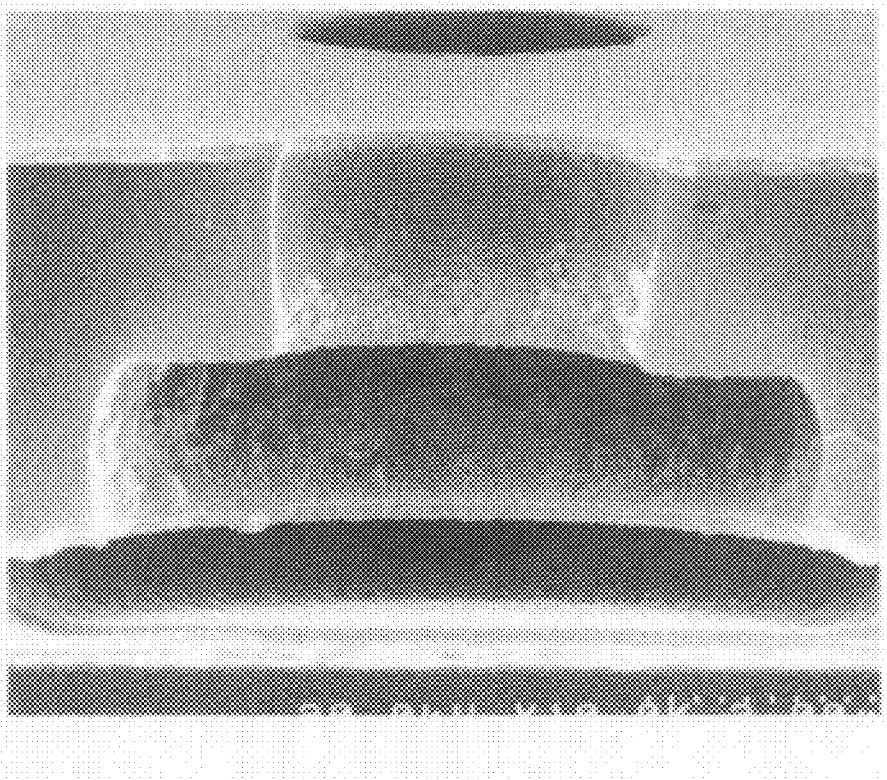

FIG. 4A shows the pattern of the gate electrode in which the first opening of the first resist and the first hole that corresponds to the first opening may be formed if the developing time of the first resist is 40 seconds. FIG. 4B shows the pattern of the gate electrode in which the first opening of the first resist and the first hole that corresponds to the first opening may be formed if the developing time of the first resist is about 60 seconds. As shown in FIGS. 4A and 4B, the first hole of the gate electrode may be formed to different sizes by controlling the developing time of the first resist.

Example embodiments provide that the first resist may be an non-photosensitive resist and the second resist may be a photosensitive resist. The first resist may be spin coated on the gate metal layer under the conditions of about 3,000 rpm and about 40 seconds and may be annealed on a hot plate at about 190° C. for five minutes. Next, the second resist may be spin coated under the conditions of about 3,000 rpm and about 40 seconds and may be annealed at about 110° C. for two minutes.

Then, the first and second resists may be exposed to UV rays of 12.7 mW for about 3.5 seconds. After performing the exposing process, the substrate may be dipped into developing solution 300 MIF to develop the first and second resists for about 45 to about 60 seconds. Then, the gate metal layer and the insulating layer may be etched.

Figure 4C:
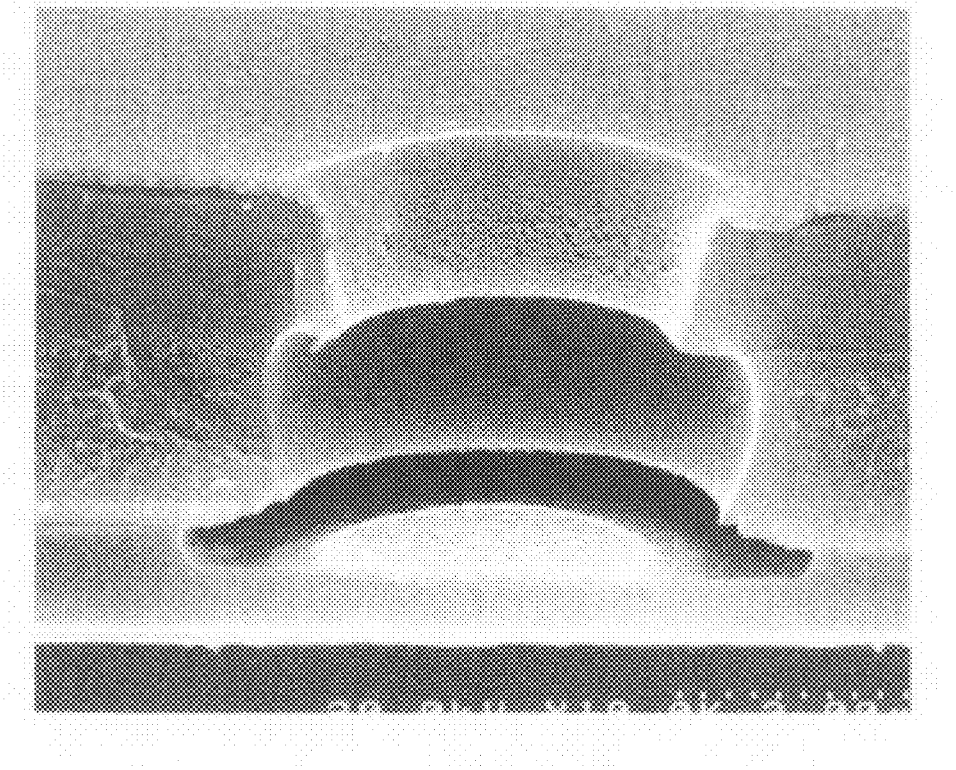
Figure 4D:
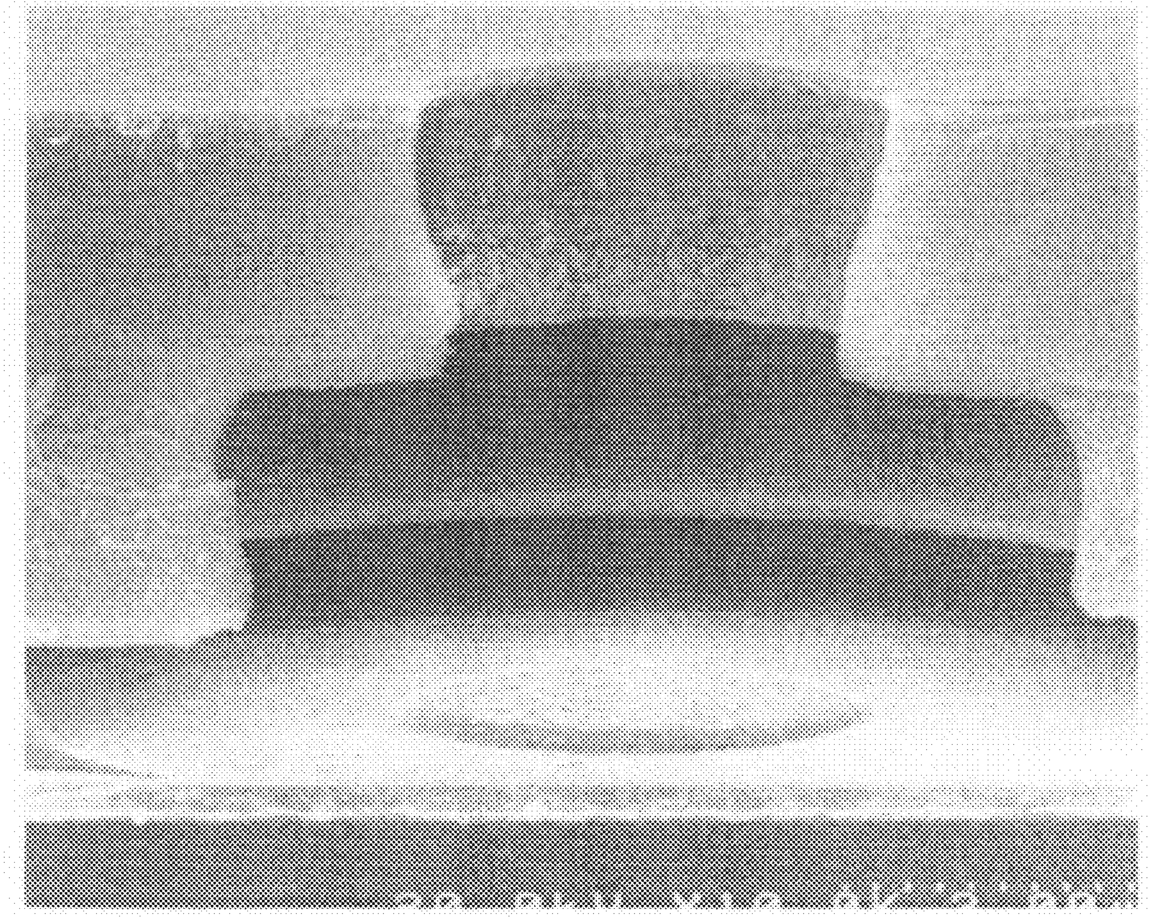

FIGS. 4C and 4D are SEM photographs showing the catalyst layer formed on the cathode after the etching process. As shown in FIGS. 4C and 4D, the pattern of the catalyst formed on the cathode may be controlled by the shape of the second opening of the second resist pattern.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A method of fabricating a triode-structure field-emission device, comprising
- sequentially forming a cathode, an insulating layer, and a gate metal layer on a substrate,
- forming a first resist pattern having a first opening on the gate metal layer,
- forming a second resist pattern having a second opening on the first resist pattern, wherein the second opening is smaller than the first opening,
- sequentially etching the gate metal layer and the insulating layer using the first resist pattern as a first mask pattern to form a gate electrode having a first hole and an insulating layer having a second hole, wherein the first hole and the second hole correspond to the first opening,
- forming a catalyst layer on the second resist pattern and on a portion of the cathode exposed through the first hole and the second hole using the second resist pattern as a second mask pattern,
- removing the first resist pattern, the second resist pattern, and the catalyst layer formed on the second resist pattern, and
- forming an emitter on the catalyst layer in the second hole.

2. The method as claimed in claim 1, wherein forming the first resist pattern having the first opening on the gate metal layer and the second resist pattern having the second opening smaller than the first opening of the first resist pattern includes
- sequentially coating a first resist and a second resist on the gate metal layer,
- exposing the first resist and the second resist, and
- developing the first resist and second resist to form the first resist pattern and the second resist pattern.

3. The method as claimed in claim 2, wherein a developing speed of the first resist is faster than the developing speed of the second resist.

4. The method as claimed in claim 2, wherein a size of the first opening is controlled by a developing time of the first resist.

5. The method as claimed in claim 2, wherein the first resist is a photosensitive resist or a non-photosensitive resist.

6. The method as claimed in claim 5, wherein the first resist is the non-photosensitive resist.

7. The method as claimed in claim 2, wherein the second resist is a photosensitive resist.

8. The method as claimed in claim 1, wherein a size of the first hole of the gate electrode is controlled by a size of the first opening of the first resist pattern.

9. The method as claimed in claim 1, wherein a size of the catalyst layer formed on the cathode is controlled by a size of the second opening of the second resist pattern.

10. The method as claimed in claim 1, wherein the emitter is formed of a nanowire, a nanotube, or nano particles.

11. The method as claimed in claim 10, wherein the nano wire, the nano tube, or the nano particles are formed of carbon or a metal oxide.

12. The method as claimed in claim 1, wherein the forming an emitter on the catalyst layer comprises:
- growing a nanowire on the catalyst layer using a chemical vapor deposition process.

13. The method as claimed in claim 12, wherein
- the chemical vapor deposition process includes at least one of $C_2H_2$, $C_2H_4$, $CH_4$, and $CO_x$ gas.

14. The method as claimed in claim 1, wherein the catalyst layer includes one of Fe, Co, Ni, and Fe—Ni alloy.

15. The method as claimed in claim 1, wherein
- the insulating layer includes one of $SiO_2$, $Si_3N_4$ and $Al_2O_3$.

* * * * *